(12) United States Patent
Kundalgurki

(10) Patent No.: US 7,259,061 B2
(45) Date of Patent: Aug. 21, 2007

(54) METHOD FOR FORMING A CAPACITOR FOR AN INTEGRATED CIRCUIT AND INTEGRATED CIRCUIT

(75) Inventor: Srivatsa Kundalgurki, Dresden (DE)

(73) Assignee: Infineon Technologies AG, Munich (DE)

( * ) Notice: Subject to any disclaimer, the term of this patent is extended or adjusted under 35 U.S.C. 154(b) by 169 days.

(21) Appl. No.: 10/891,051

(22) Filed: Jul. 15, 2004

(65) Prior Publication Data
US 2006/0014343 A1    Jan. 19, 2006

(51) Int. Cl.
  *H01L 21/8242*    (2006.01)
(52) U.S. Cl. ................ 438/244; 438/255; 257/E21.396
(58) Field of Classification Search ................ 438/244
  See application file for complete search history.

(56) References Cited

U.S. PATENT DOCUMENTS

| | | | |
|---|---|---|---|
| 5,182,232 A * | 1/1993 | Chhabra et al. ............ | 438/255 |
| 5,354,705 A | 10/1994 | Mathews et al. | |
| 5,723,373 A | 3/1998 | Chang et al. | |
| 6,194,755 B1 * | 2/2001 | Gambino et al. ............ | 257/301 |
| 6,448,131 B1 * | 9/2002 | Cabral et al. ................ | 438/243 |
| 2004/0040863 A1 * | 3/2004 | Lee et al. .................... | 205/640 |
| 2004/0185636 A1 * | 9/2004 | Marsh ........................ | 438/398 |

FOREIGN PATENT DOCUMENTS

EP    1 298 716 A1    4/2003

* cited by examiner

*Primary Examiner*—Chandra Chaudhari
(74) *Attorney, Agent, or Firm*—Edell, Shapiro & Finnan, LLC

(57) ABSTRACT

Integrated circuits can include an integrated capacitor with a metal alloy layer. Methods for forming such integrated circuits can include providing a substrate, forming a first electrode including depositing a metal alloy layer having a first surface and an exposed second surface, etching the exposed second surface of the metal alloy layer thereby increasing the surface roughness of the second surface of the metal alloy layer, forming a capacitor dielectric on the first electrode and forming a second electrode on the capacitor dielectric. By providing a metal alloy layer and etching the second surface of the metal alloy layer, an increased capacitance of the integrated capacitor is achieved.

17 Claims, 9 Drawing Sheets

5 nm < d < 50 nm
(5 nm < d < 20 nm)

METHOD FOR FORMING A CAPACITOR FOR AN INTEGRATED CIRCUIT AND INTEGRATED CIRCUIT

FIELD OF THE INVENTION

The invention relates to a method for forming a capacitor for an integrated circuit, and to an integrated circuit comprising an integrated capacitor.

BACKGROUND

Integrated circuits like memory circuits comprise memory cells in which digital information are stored. DRAMs (Dynamic Random Access Memories) comprise memory cells in which the information is stored by electrical charges accumulated in a capacitor. A capacitor of a memory cell is usually formed as a stacked capacitor or as a deep trench capacitor. A deep trench capacitor is formed by etching a deep trench into a substrate, forming a first electrode in a substrate region surrounding the sidewalls and the bottom of the deep trench, by depositing a capacitor dielectric on the bottom and on the sidewalls of the trench and by filling the trench with a conductive material thereby forming the second electrode. The second electrode is connected to a source/drain-region of a transistor. Another source/drain-region of the transistor is connected to the bitline. The gate electrode of the transistor is connected to the wordline.

Due to the shrinking dimensions of memory cells of future generations of memory products, it becomes increasingly difficult to store a sufficiently large amount of electrical charges in the memory cell. If a storage capacitor is formed as a deep trench capacitor, reducing memory cell dimensions requires decreasing the lateral cross-section of the deep trench capacitor. The maximum depth of a deep trench capacitor cannot be increased without narrowing the process window of the process technology. Accordingly, the capacitance of an integrated capacitor decreases with shrinking memory cell dimensions unless appropriate measures are taken to enlarge the capacitance per capacitor plate surface of the integrated capacitor. A sufficiently high total capacitance of an integrated capacitor is required for preserving a sufficiently large amount of charges during the refresh time in order to allow safe reading of the stored digital information.

It is known that a sacrificial undoped layer of hemispherical grain silicon (HSG) can be provided as a mask over polysilicon. The polysilicon layer is etched using the HSG-silicon layer as an etching mask. The HSG-silicon layer is then removed from the polysilicon layer. It is also known to form mesopores in a substrate by annealing the substrate in a furnace in an atmosphere containing oxygen.

Another approach used for deep trench capacitors is widening a lower trench portion. The surface of the capacitor plates is increased. Trench-widening is called "bottling" and is performed by wet etching of a lower trench portion below an upper trench portion where an isolation collar is to be formed later. During wet etching, an upper trench portion is protected by a protecting layer in order to preserve lateral trench dimensions in the upper trench portion close to the substrate surface.

Widening the cross-section of a lower trench portion, however, increases the risk of short-circuits between deep trench capacitors of adjacent memory cells. Furthermore, this technique is only applicable to deep trench capacitors but not to stacked capacitors.

Though the hemispherical grain technique increases the capacitance of deep trench capacitors and stacked capacitors to some extent, techniques for further increasing the capacitance are required.

SUMMARY

To increase the capacitance of an integrated capacitor of an integrated circuit, an integrated circuit can include a capacitor capable of storing a higher amount of electric charges. Furthermore, a method for forming such an integrated circuit is desirable.

A method for forming a capacitor for an integrated circuit can include providing a substrate, forming a first electrode including depositing a metal alloy layer having a first surface and an exposed second surface, etching the exposed second surface of the metal alloy layer thereby increasing the surface roughness of the second surface of the metal alloy layer, forming a capacitor dielectric on the first electrode, and forming a second electrode on the capacitor dielectric.

According to the invention, a metal alloy layer can be formed before depositing the capacitor dielectric. The metal alloy layer can form part of the first electrode and can have an interface surface abutting to the capacitor dielectric. The capacitor including the metal alloy layer can store a relatively higher charge compared to a capacitor having electrodes, which do not include a metal alloy layer. As one interface surface of the metal alloy layer abuts the capacitor dielectric, the enlarged amount of charges can be stored adjacent to the capacitor dielectric at the minimum distance from the other electrode. The minimum distance can correspond to the thickness of the capacitor dielectric.

The metal alloy layer, which can form one of the plates of the capacitor, can be alloyed with suitable metals during the course of the deposition. The selection of the alloying elements and the optional annealing conditions of post deposition thermal annealing can lead to the segregation of the alloying elements along the grain boundaries of the metal alloy layer. Since the stoichiometry of intergranular regions can be different from that of the parent metal alloy grains, by selecting suitable etchant and processing conditions, the grain boundaries can be etched selective to the grain material. This selective metal etch, commonly called "intergranular corrosion," can be the main method proposed to create roughness on the metal alloy layer electrode surface.

Increasing the surface roughness by etching a metal alloy layer, in particular, by selective etching of intergranular regions selectively to the grains, is a technique which is not known from the hemispherical grain technique. According to the invention, deep microscopic recesses can be formed by controlled selective etching of the metal electrode layer. The roughened surface of the etched metal alloy layer in combination with the higher capacitance of the metal alloy layer electrode can increase the total capacitance of the integrated capacitor. Due to the increased capacitance of the integrated capacitor, enhanced widening of the lower trench portion of a deep trench capacitor may no longer required.

The etching of the metal alloy layer can be performed either by using chemical or electrochemical methods. Either method can be used under appropriate processing conditions to induce selective intergranular regions boundary attack within the metal electrode layer. During electrochemical etching, the substrate can be immersed in an electrolyte and can be made an anode in an electrochemical cell arrangement. A second electrode, the counter-electrode or cathode, can be held at a negative terminal of a power supply driving the electrochemical cell. The metal alloy layer of the substrate can be subject to anodic chemical reactions. These reactions can include dissolving metal ions and thereby etching or removing metal material. Anodic chemical reactions can also include a combination of etching and intergranular corrosion of intergranular material between the grain boundaries within the metal alloy layer. By choosing appropriate processing conditions, the selectivity of the attack of intergranular material can be increased to that of the grain thereby increasing the net roughening effect.

When an electrochemical method is used for controlled selective etch of the metal alloy layer electrode, the galvanic potential difference between the grain material and the intergranular material in a suitable electrolyte can be used to drive the selective intergranular attack.

Alternatively, a method for forming a capacitor for an integrated circuit can include providing a substrate, forming a first electrode comprising a metal alloy layer, the metal alloy layer having a first surface and an exposed second surface, increasing the surface roughness of the second surface of the metal alloy layer by etching, forming a metal oxide layer on the metal alloy layer by oxidizing the roughened second surface of the metal alloy layer, and depositing a second electrode. A metal oxide layer can be formed on the metal alloy layer having a surface with a surface roughness increased by etching. As the metal alloy layer forms part of the first electrode, a relatively large amount of charge can be stored very close to the metal oxide layer. The metal oxide layer can form part of a capacitor dielectric between the first and the second electrode. As the metal oxide layer is deposited on the roughened second surface of the metal alloy layer, the effective surface of the capacitor plates of the first and second electrodes can be increased, thereby, further increase of capacitance can be achieved.

The surface roughness of the second surface of the metal alloy layer can be increased by electrochemical etching, during electrochemical etching the substrate being immersed in an electrolyte and being held at an anodic potential. The substrate, for instance, may be immersed in an electrolyte. For example, an electrolyte containing sulphuric acid and hydrogen peroxide may be used.

The metal alloy layer can include grains having grain boundaries and being separated from one another by intergranular regions. The intergranular regions can have a lower degree of crystalline order than the grains. Accordingly, in the intergranular regions, an intergranular material having a lower degree of crystalline order compared to the material of the grains can be provided. The grains can be confined by grain boundaries. Between the grains, that is, in the gaps between the grains, intergranular material of lower crystalline order can be provided.

In a metal alloy, there may be no monocrystalline order, like in epitaxial layers. Instead, regions of a relatively high crystalline order can exist, which in the present application are referred to as grains. Between adjacent grains, there can exist a transition region in which the local crystalline order changes from the crystalline order of a first grain to a crystalline order of a second grain. For instance, the orientations of the symmetry axes of the crystal lattice can be non-uniform in the intermediate region between adjacent grains. In the intergranular regions between the grains, intergranular material can be present. A metal alloy layer can thus include grains and intergranular material therebetween. In general, a metal alloy material includes grains and intergranular regions on a microscopic scale. Accordingly, an alloyed metal can be used for the metal alloy layer. As an example, an alloy of aluminum and copper may be used. For the subject application, the choice of the metal alloy layer material and the alloying elements may be based on grain size, selectivity for localized grain boundary attack during etch, electrical resistance, thermal stability as well as other overall integration considerations.

During etching of the metal alloy layer, the intergranular regions can be etched selectively to the grains. As the degree of crystalline order in the intergranular regions can be relatively lower compared to the grains, the intergranular material can be relatively more susceptible to etching and dissolution than the grains. According to the invention, the increased etching rate of intergranular material compared to the grains can be exploited in order to achieve the technical effect of roughening the second surface of the metal alloy layer. Thereby, hemispherical grain formation may not be required.

According to an embodiment of the invention, however, the metal alloy layer may be subject to a thermal treatment at an increased temperature prior to etching of the metal alloy layer. This thermal treatment can be performed at a moderate temperature and can serve to adjust the mean size of the grains of the metal alloy layer. The thermal treatment can be performed such that the average grain size can be reduced and the amount of grain boundary material can be increased. Thereby, more microscopic recesses may be formed.

According to a preferred embodiment, after selective etching of the intergranular regions, the exposed surface of the metal alloy layer can be oxidized. Thereby the grains as well as the intergranular regions close to the exposed surface can be converted into an oxide to form a continuous dielectric oxide layer. The metal alloy layer thereby can be oxidized, either electrochemically or thermally, to form a surface metal oxide on the metal alloy layer electrode. This surface oxide can then serve as the capacitor dielectric. In such a case, further capacitor dielectric deposition step may not be required.

In one implementation, the metal alloy layer can be formed by atomic layer deposition or by chemical vapor deposition. The metal alloy layer can be deposited, for example, as a continuous conformal liner.

Providing a substrate can include forming a deep trench in a main surface of the substrate. Alternately, a lower portion of the deep trench can be widened by a wet etching. Thereby, the effective surface of the deep trench capacitor can be increased. However, compared to known deep trench widening, a lower extent of trench widening can be required because the capacitance is already increased by providing the metal alloy layer and roughening the exposed surface of the metal alloy layer.

A first integrated circuit having an integrated capacitor can include a first electrode comprising a metal alloy layer having a first surface and a second surface, a capacitor dielectric provided on the second surface of the metal alloy layer, and a second electrode provided on the capacitor dielectric. The second surface can have a surface roughness, which is greater than a surface roughness of the first surface of the metal alloy layer.

In the absence of the metal alloy layer, the capacitor dielectric could be provided on a surface of the first electrode having a relatively low surface roughness. According to the invention, the metal alloy layer can have a second surface abutting the capacitor dielectric and a relatively greater surface roughness than the first surface. Accordingly, the capacitance of the capacitor including the metal alloy layer can be increased. Furthermore, the metal alloy layer can allow accumulation of a relatively larger amount of charge close to the capacitor dielectric. This effect can also increase the capacitance of the integrated capacitor.

The capacitor dielectric can include a metal oxide layer having the same metals as the metal alloy layer and being in contact with the second surface of the metal alloy layer. The metal oxide layer can be a dielectric layer formed by oxidizing an exposed surface of the metal alloy layer during the production of the integrated circuit. Thus, the metal oxide layer can include the same metal or combination of metals as the metal alloy layer. The oxide layer, for example, can be in contact with the second electrode.

Alternatively, the capacitor dielectric may include a further dielectric layer disposed between the metal oxide layer and the second electrode. The capacitor dielectric may also include the metal oxide layer to reduce the process complexity during the integrated circuit manufacture since no further dielectric layer for the capacitor dielectric may need to be deposited.

An integrated circuit having an integrated capacitor can include a first electrode comprising a metal alloy layer having a first surface and a second surface, a metal oxide layer in contact with the second surface of the metal alloy layer, and a second electrode. The second surface can have a surface roughness which is relatively greater than a surface roughness of the first surface of the metal alloy layer.

The metal oxide layer, can, for example, include the same metals as the metal alloy layer. The capacitor dielectric may include the metal oxide layer, for instance. Alternatively, a dielectric layer can be disposed between the metal oxide layer and the second electrode.

In one implementation, the metal alloy layer can include a binary metal alloy of a first metal and a second metal. The metal alloy layer can include grains having grain boundaries and being separated from one another by intergranular regions. The regions can have a lower degree of crystalline order than the grains. In general, any metal alloy can be used for the metal alloy layer because each metal alloy layer can have grains of relatively high crystalline order and can further include intergranular regions of a relatively lower crystalline order. As an example, the binary alloy may include aluminum and copper. The aluminum-copper layer may include a large quantity of aluminum and a low quantity of copper, for example, less than 10%.

The grains can have, for instance, a higher concentration of the first metal than the grain boundaries and the grain boundaries can have a higher concentration of the second metal than the grains. For instance, the concentration of aluminum can be relatively higher in the grains as compared to the grain boundaries, whereas the grain boundaries can have the relatively higher concentration of copper.

The grains can have a size of have a grain size of between 5 and 50 nm, for example, between 5 and 20 nm, on average. Accordingly, an average grain size can be less than 20 nm on average. The grain size is the diameter of the grains, that is, the maximum extension of an average grain taken between one surface portion of the grain and an opposed surface portion of the same grain. Though the diameter of the grains is regarded as an appropriate measure of the grain size, the grains, in general, may not be spherical. Instead, the grains can be irregularly shaped. However, an average diameter may be attributed to the grain size in order to define the spatial extension, that is, the dimension of the grains.

The average grain size may be adjusted by applying a thermal treatment following the metal electrode layer deposition but before the selective etching.

The capacitor dielectric can, for example, include hafnium oxide or aluminum oxide. These materials have a high dielectric constant or permittivity. Aluminum containing oxide can be formed by passivating, that is, by oxidizing an aluminum containing alloy layer.

The capacitor can, for instance, be a deep trench capacitor provided in a deep trench. Alternatively the capacitor can be a stacked capacitor.

One of the first and second electrode can be electrically connected to a transistor. The transistor can be connected to a wordline and to a bitline. The transistor can be a selection transistor, which can be opened by activating the wordline and the bitline. A digital information may then be stored in the capacitor or read out from the capacitor.

The integrated circuit can, for example, be a memory circuit of a volatile semiconductor memory, such as a DRAM.

BRIEF DESCRIPTION OF THE FIGURES

The invention will now be explained in more detail with reference to the accompanying figures.

Like reference symbols in the various drawings indicate like elements.

DETAILED DESCRIPTION

Figure 1:
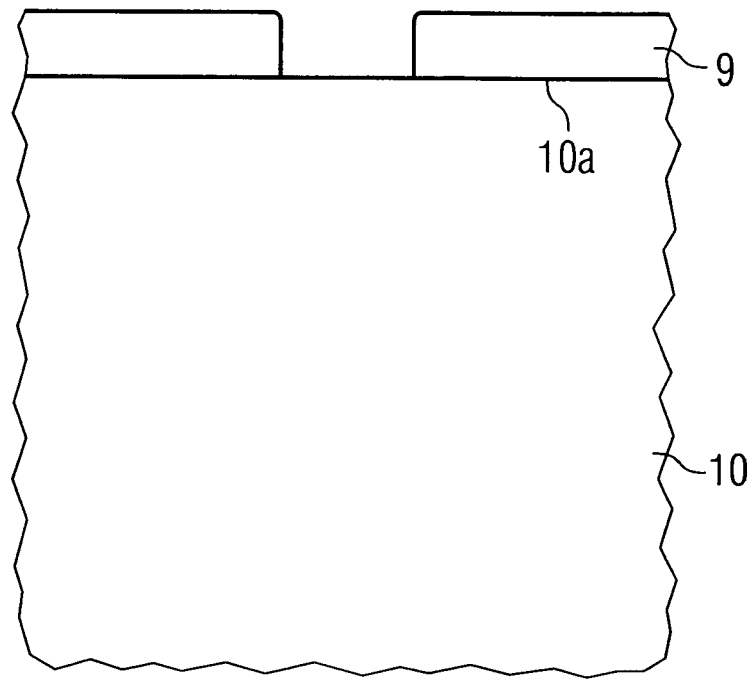
FIGS. 1 to 8 show a method according to the invention.

Referring to FIG. 1, a substrate 10 is provided and a main surface 10a of the substrate is covered with a mask layer 9. The mask layer 9 can be patterned to form an opening in the mask layer 9 where a deep trench capacitor is to be formed. The substrate 10 can, for example, be a silicon substrate.

Figure 2:
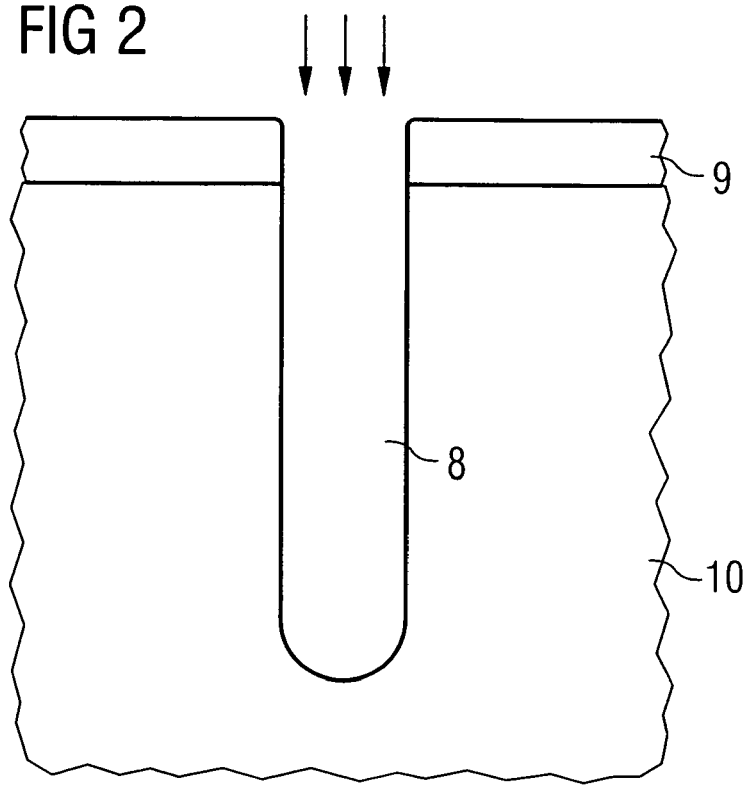

Referring to FIG. 2, anisotropic etching can be performed, thereby forming a deep trench in the substrate 10. Anisotropic etching can, for example, be performed by dry etching.

Figure 3:
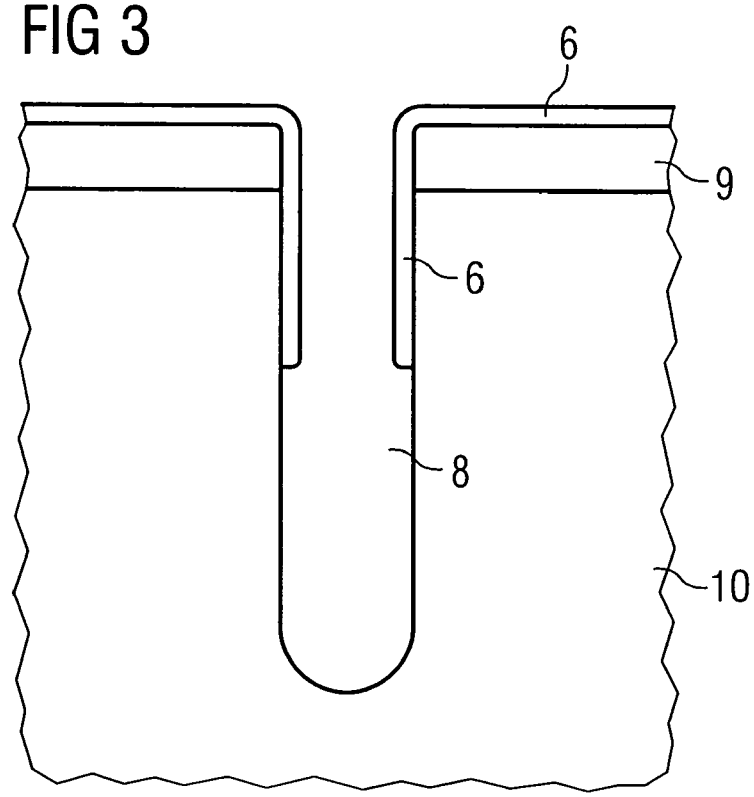

Referring to FIG. 3, a protective layer 6 can be formed on an upper portion of the trench 8 and on the mask layer 9. The protective layer 6 can serve to prevent unintended widening of the cross-section of the trench in an upper trench portion and unintended doping of an upper trench portion with a dopant for forming the first electrode.

Figure 4:
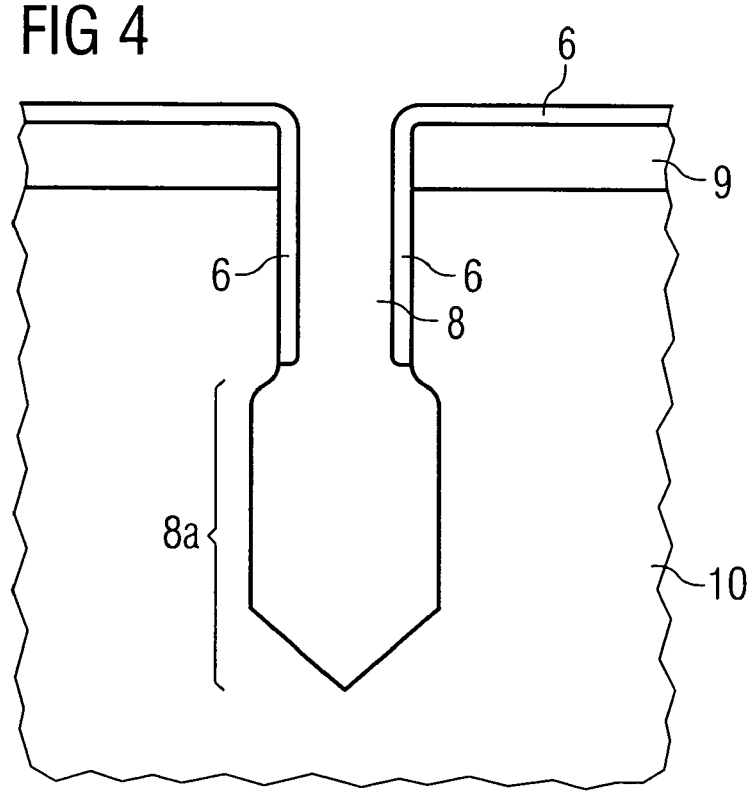

Referring to FIG. 4, trench bottling can be performed using protective layer 6 as mask. During the trench bottling, the lateral cross-section of a lower trench portion 8a of the trench 8 can be enlarged, for instance, by wet etching. Thereby, the exposed surface region of the substrate within the lower trench portion 8a and the capacitance of the deep trench capacitor can be increased. Applying protective layer 6, trench bottling, and removing protective layer 6 can be optional.

Figure 5:
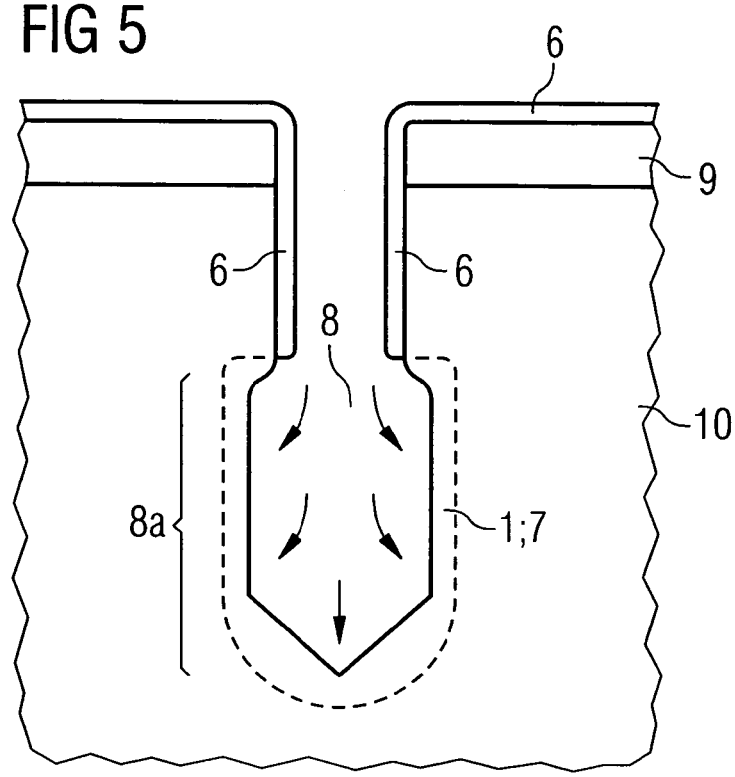

Referring to FIG. 5, a first electrode 1 can be formed in the substrate by doping a substrate region surrounding the exposed substrate surface in the lower portion 8a of the trench 8. In the upper portion 8a of the trench 8 and on the exterior surface of the substrate 10 doping can be prevented by the protective layer 6 and/or by the mask layer 9. Doping can, for instance, be performed by gas phase doping. After the gas phase doping, the protective layer 6 can be removed. After trench bottling and gas phase doping, the protective layer 6 can be removed.

Figure 6:
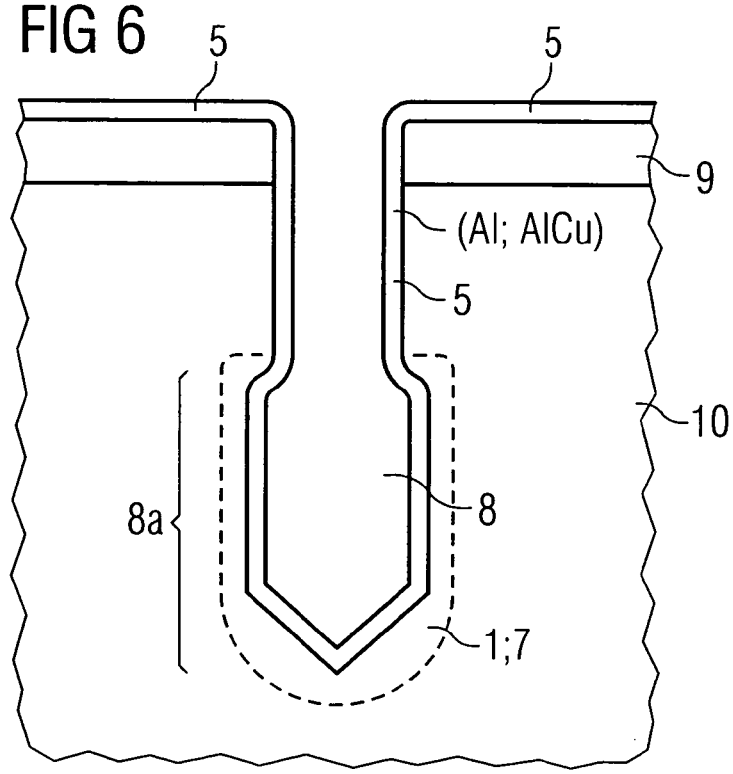

Referring to FIG. 6, a metal alloy layer 5 can be deposited as a continuous conformal liner over the doped substrate region in the lower portion 8a of the trench 8. The metal alloy layer, can, for instance, be a metal alloy layer including a binary alloy, for instance, of aluminum and copper. Alternatively, the metal alloy layer may be a metal alloy layer including more than two different metallic elements.

Figure 7:
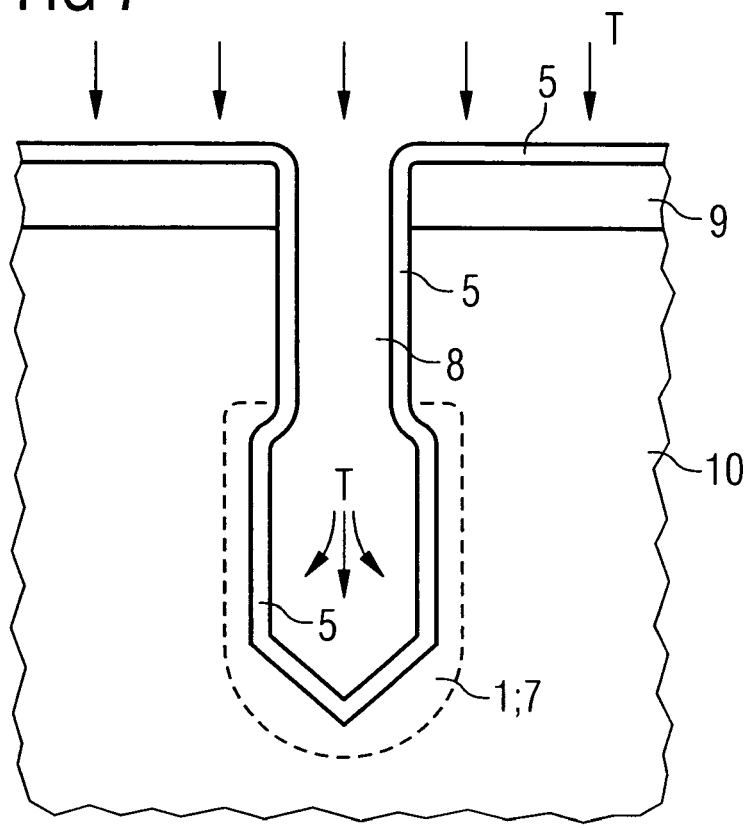
Figure 8:
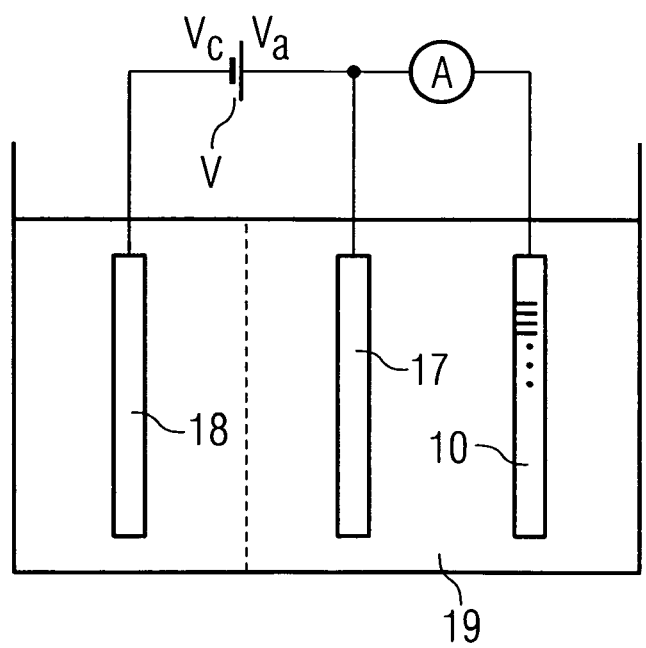

Referring to FIG. 7, an optional thermal treatment can be performed. The thermal treatment can be performed at a temperature T, which is higher than the room temperature and can adjust the average grain size of grains in the metal alloy layer 5. The metal alloy layer 5 can include grains of relatively high cyrstallographic order and intergranular regions filled with intergranular material of relatively low crystalline order. By applying heat to the metal alloy layer 5, the average grain size can, for instance, be reduced in order to etch a larger number of recesses into the metal alloy layer. Etching can, for example, be performed by electrochemical etching, as illustrated in FIG. 8. According to FIG. 8, the semiconductor substrate 10 can be immersed in an electrolyte 19 and electrically connected to an anodic potential Va. A counter electrode 18 can be held at a cathodic potential Vc. The difference between the potentials Va and Vc is the voltage V applied for electrolytic etching. Electrolytic etching can increase the roughness of an exposed surface of the metal alloy layer 5 in the trench 8. A reference electrode 17 can further be provided in the electrolyte 19 for process monitoring and control.

Figure 9:
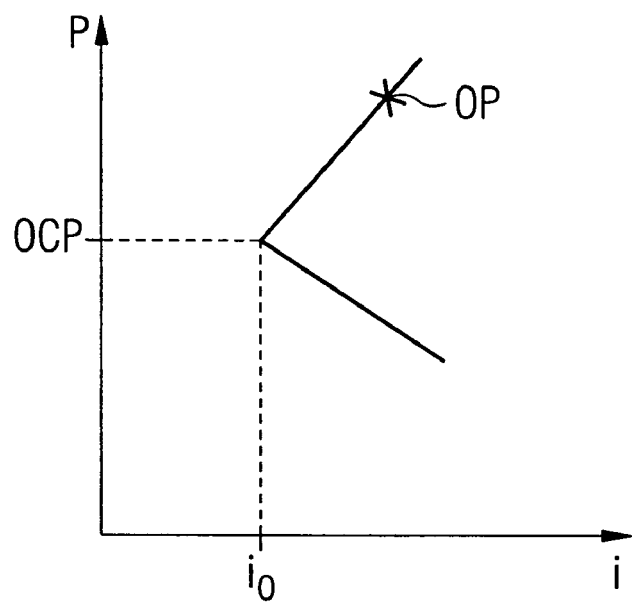
FIG. 9 shows an Evans-diagram for the electrolytical etching of FIG. 8.

FIG. 9 illustrates an Evans-diagram for the electrolytic etching system in FIG. 8. The horizontal axis in FIG. 9 represents the current density i. The vertical axis in FIG. 9 represents the electric potential P. On the horizontal axis, $i_o$ represents the equilibrium current density in a state in which the anodic and cathodic reactions are in equilibrium and with no external potential being applied. Depending on whether the potential applied to the substrate is anodic or cathodic to the open circuit potential OCP, the substrate can be subject to either anodic oxidation or cathodic reduction.

In FIG. 9, the straight line having a positive gradient represents the anodic curve and the straight line having a negative gradient represents the cathodic curve. The anodic curve is relevant to the electrochemical etching because an anodic reaction is required for creating the roughness on the metal electrode. The operating point OP corresponds to the anodic potential at which the substrate can be maintained during the electrochemical etching.

Figure 10:
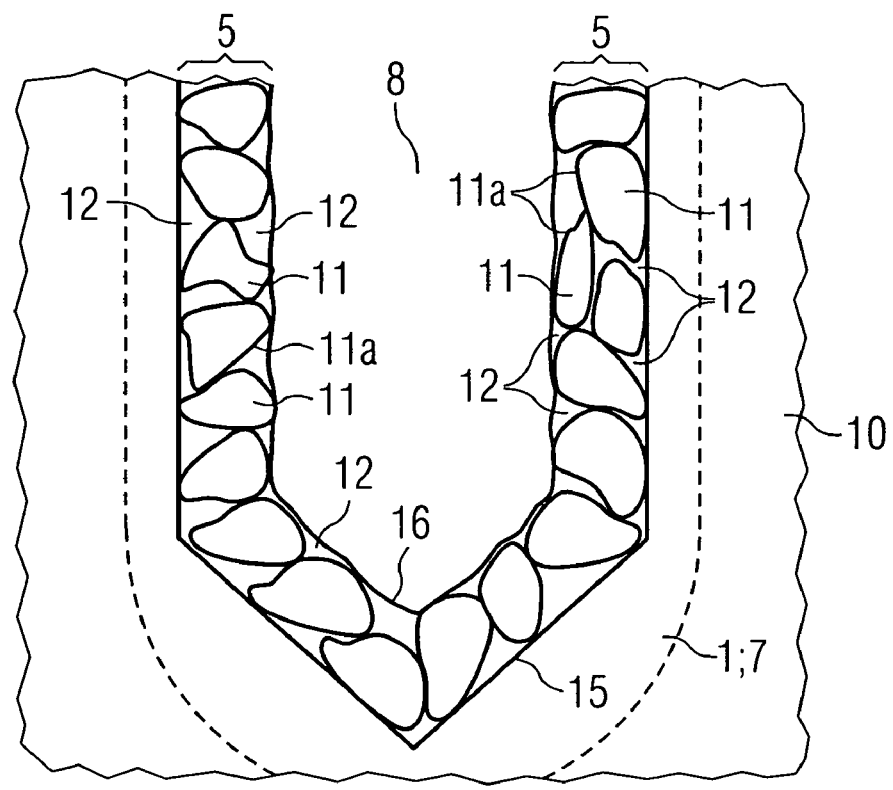
FIGS. 10 to 13 show an enlarged detail of a capacitor during the method according to the invention.

FIG. 10 illustrates an enlarged view of the bottom of the trench 8 in FIG. 7. On the bottom and on the sidewalls of the trench 8, the metal alloy layer is shown. FIG. 10 illustrates the microscopic structure of the metal alloy layer 5. The metal alloy layer 5 can include grains 11 of a relatively high degree of crystalline order. In between the grains 11, grain boundaries 12 of relatively low degree of crystalline order can be provided. The metal alloy layer 5 can have a first surface 15 adjacent to the doped substrate region 7 of the substrate 10. The metal alloy layer 5 can further have a second surface 16, which is exposed in FIG. 10. The second surface 16 can be relatively smooth. Furthermore, the grains 11 can be relatively large in diameter.

Figure 11:
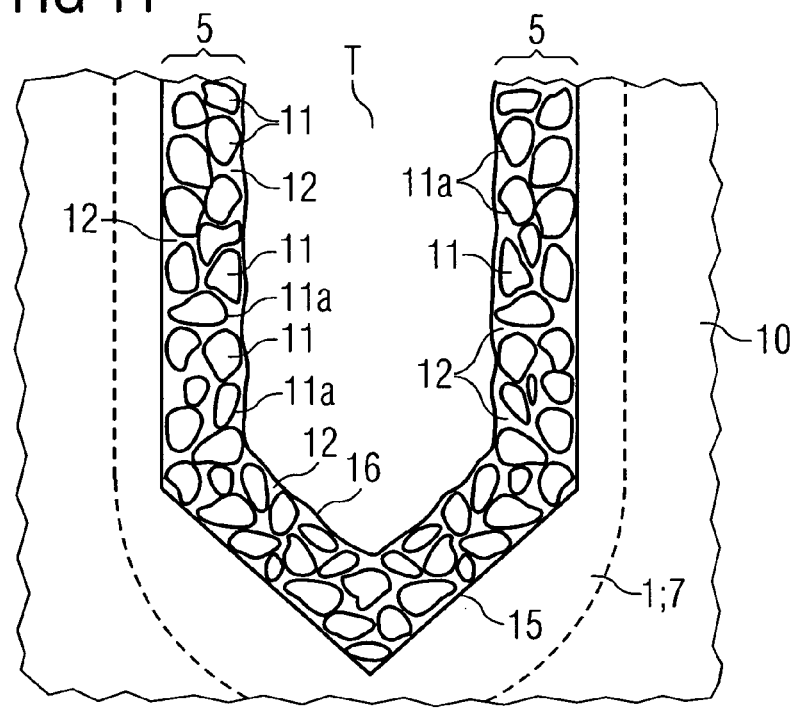

With reference to FIG. 11, an optional thermal treatment at a temperature T above room temperature can be performed. Thereby, the mean size of the grains 11 in the metal alloy layer 5 can be adjusted. The thermal treatment can, for example, be performed such that the average grain size is reduced, for instance, to an average grain size d of less than 20 nm. The supplied heat can allow the grains 11 to segregate into smaller grains.

Figure 12:
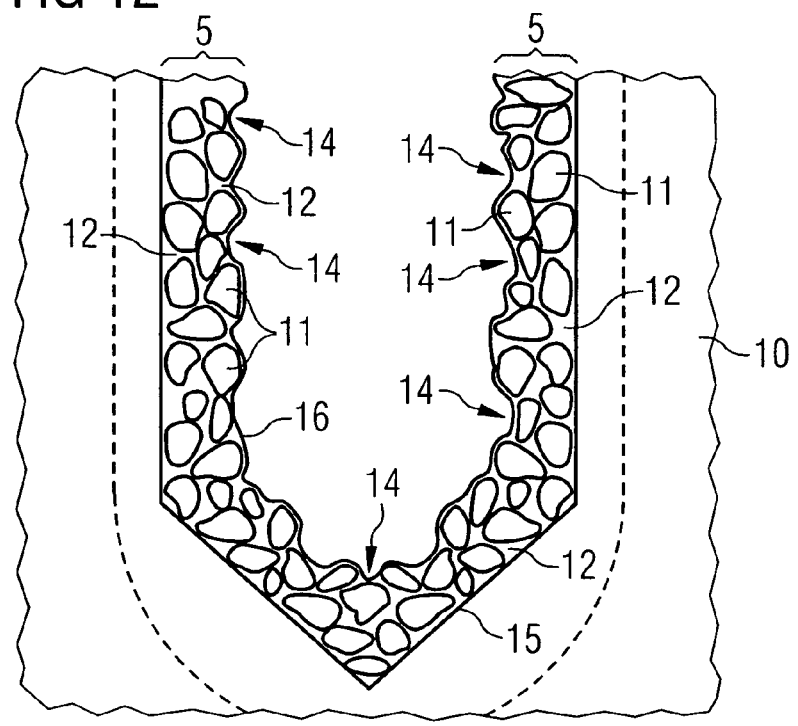

With reference to FIG. 12, the roughness of the second surface 16 can be increased by an etching. The etching can be performed such that the grain boundaries 12 can be etched at a higher etching rate than the grains 11. Thereby, microscopic recesses 14 can be formed in between the grains 11 on the surface 16 of the metal alloy layer 5. Accordingly, the intergranular regions 12 of the metal alloy layer 5 can be etched selectively to the grains 11. The etching can promote intergranular corrosion and/or pitting of the material of the metal alloy layer 5. The etching can be performed by an electrochemical method using the apparatus illustrated in FIG. 8 or using a chemical etch method. After this etching, the exposed surface area of the metal alloy layer 5 and the roughness of the second surface 16 can be increased.

Figure 13:
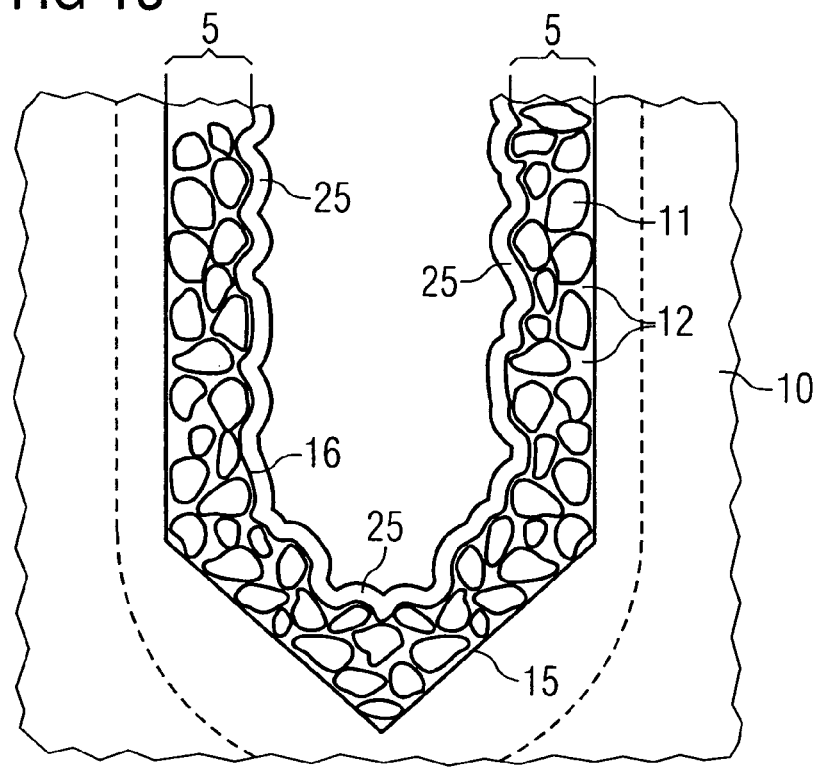

Referring to FIG. 13, an optional oxidation can be performed in which a dielectric layer, in particular, a metal oxide layer 25 can be formed on the metal alloy layer 5. The material of the metal alloy layer 5 can, for instance, be oxidized, thereby, being converted into a metal oxide layer 25. The metal oxide layer grown on the metal alloy layer 5 can be a dielectric and may serve as a layer of the capacitor dielectric of the integrated capacitor to be formed. However, the metal oxide layer 25 may not be formed in case another dielectric layer is formed on the second surface 16 of the metal alloy layer 5.

The metal oxide layer 25, since it is formed by oxidizing the material of the metal alloy layer 5, can include the same metal as the metal alloy layer 5. In case the metal alloy layer 5 can be a metal alloy layer, the metals in the metal alloy layer 5 can also be in the metal oxide layer 25.

Figure 14:
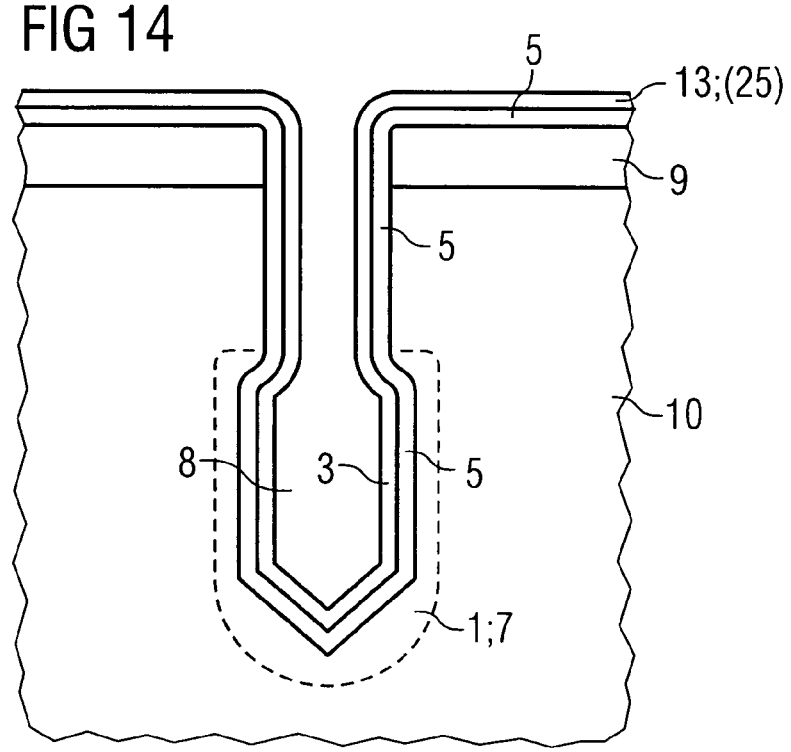
FIGS. 14 to 16 show the same method according to the invention.

Referring to FIG. 14, a dielectric layer 13 can be deposited on the metal alloy layer 5 of FIG. 12. The dielectric layer 13 can be deposited directly on an exposed surface of the metal alloy layer 5. The dielectric layer 13 can form the capacitor dielectric 3 separating the second electrode 2 from the first electrode 1. Alternatively, the capacitor dielectric 3 may further include layers not illustrated in FIG. 14.

Figure 15:
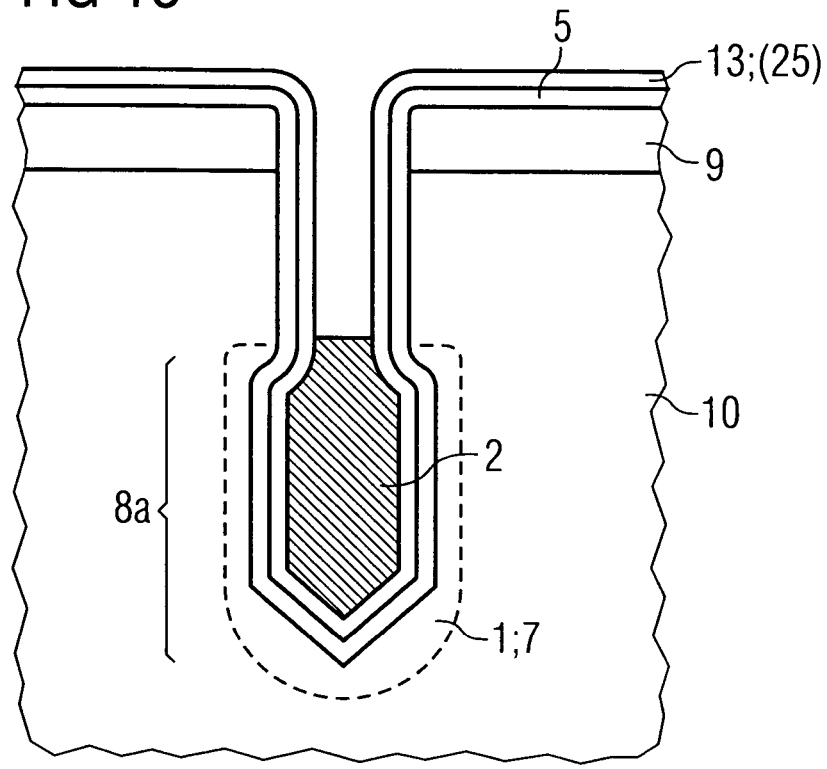

Referring to FIG. 15, the second electrode 2 can be formed within the trench. First, a conductive layer of doped polysilicon, for instance, can be deposited in the trench 8 and on the exterior substrate surface. The polysilicon can then be recessed thereby removing it from the exterior substrate surface and from an upper portion of the trench 8. The conductive material for the second electrode 2 can be maintained in the lower trench portion 8a. Thereby, the center node of the deep trench capacitor can be formed.

Figure 16:
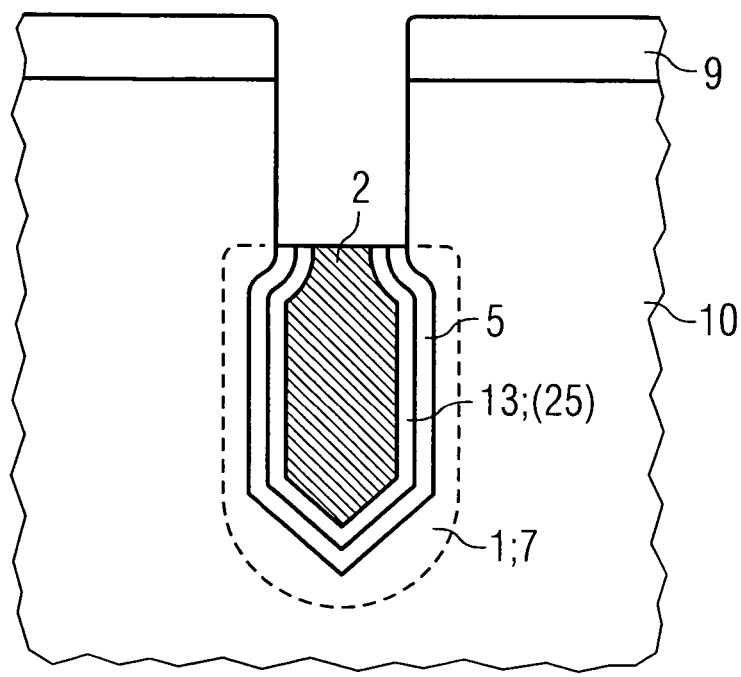

Referring to FIG. 16, the dielectric layer 3 and the metal alloy layer 5 can be removed from the upper trench portion and from the exterior substrate surface. The method can then form an isolation collar in the upper trench portion and form transistors and other components of the integrated circuit, as already known in the art.

FIGS. 14 to 16 also illustrate an alternative embodiment in which the capacitor dielectric 3 is formed using a dielectric deposition step rather than using the metal oxide layer 25 as the node dielectric. In this alternative, the second electrode 2 can be deposited following the node dielectric deposition.

Figure 17:
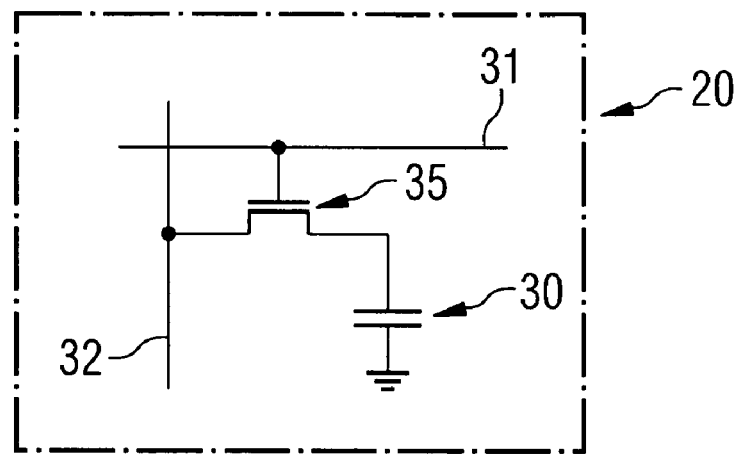
FIG. 17 shows a schematic view of an integrated circuit including a capacitor and a transistor.

FIG. 17 illustrates a schematic view of an integrated circuit having a plurality of memory cells including a transistor 35 and a capacitor 30. One memory cell is illustrated in FIG. 17. The capacitor 30 can be formed according to the invention as described in the present application. One electrode of the capacitor can be electrically connected to one source/drain-region of the transistor. The other source/drain-region of the transistor can be connected to a bitline 32. A gate electrode of the transistor 35 can be connected to a wordline 31. The transistor can, for example, be a MOSFET (Metal Oxide Semiconductor Field Effect Transistor). The capacitor 30 can, for example, be a deep trench capacitor including a metal alloy layer. In the case that the capacitor is a deep trench capacitor, the second electrode forming the center node can be electrically connected to one source/drain-region of the transistor 35. Each memory cell of the integrated circuit 20 can include an integrated capacitor 30 having a metal alloy layer 5. The metal alloy layers 5 of the capacitors may have an interface surface, which abuts the capacitor dielectric 3 and which has a greater surface roughness than another interface surface of the metal alloy layer 5.

Figure 18:
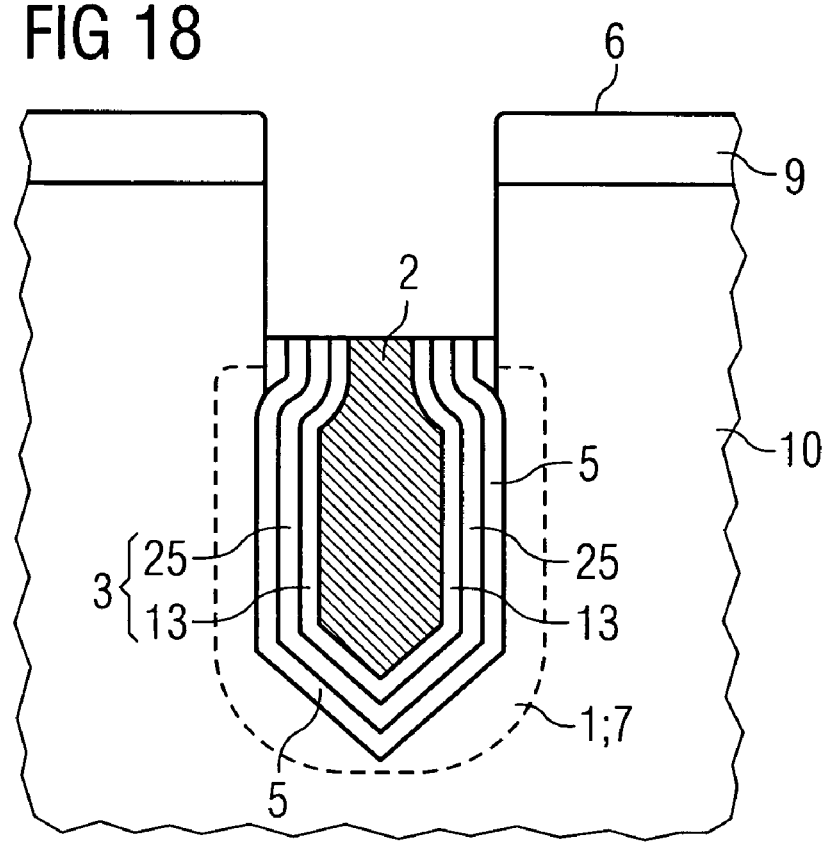
FIG. 18 shows a method step of an alternative method according to the invention, the step of FIG. 18 corresponding to the step of FIG. 16.

FIG. 18 illustrates yet another embodiment of a method according to the invention. According to this method, an integrated capacitor can be formed with a capacitor dielectric 3, which can include a metal oxide layer 25 of FIG. 13 and a dielectric layer 13 deposited thereon. After performing the above described method, for example, as shown in FIGS. 1 to 13, the metal oxide layer 25 can be formed on the metal alloy layer 5 and the capacitor dielectric 13 can be deposited on the metal oxide layer 25. Subsequently, a conductive material for the second electrode 2 can be deposited and recessed and the dielectric layer 13 and the metal oxide layer 25 can be removed in the upper trench portion, as illustrated in FIGS. 15 and 16. Thereby, the semiconductor product illustrated in FIG. 18 can be achieved. The subsequent isolation collar formation and transistor manufacture, for example, can then be performed as known in the art. According to this embodiment, a doped substrate region 7 and the metal alloy layer 5 can form the first electrode 1 and the metal oxide layer 25 and the dielectric layer 13 can form the capacitor dielectric 3.

By providing a thin metal liner or metal alloy liner as metal alloy layer 5 which is susceptible to intergranular corrosion and/or electrochemical pitting, the capacitance of an integrated capacitor in an integrated circuit can be increased. Thereby, widening the cross-section of a lower trench portion of a deep trench capacitor may be limited to a smaller final cross-section or may even be avoided. The surface roughness of an exposed surface of the metal alloy layer 5 can be, for example, increased by electrochemical etching under appropriate etching conditions, thereby, promoting preferential grain boundary attack and/or pitting. The preferential attack on grain boundaries by etching can lead to the creation of grain level roughness. Furthermore, providing a metal alloy layer adjacent to the capacitor dielectric can allow a relatively high amount of charge to be stored in close proximity to the capacitor dielectric.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCES

1 First electrode
2 Second electrode
3 Capacitor dielectric
5 Metal alloy layer
6 Protective layer
7 Doped substrate region
8 Deep trench
8a Lower trench portion
9 Mask layer
10 Substrate
10a Main surface
11 Grains
11a Grain boundaries
12 Intergranular region
13 Dielectric layer
14 Recesses
15 First surface
16 Second surface
17 Reference electrode
18 Counter electrode
19 Electrolyte
20 Integrated circuit
25 Metal oxide layer
30 Capacitor
31 Wordline
32 Bitline
35 Transistor
A Ampere meter
d Average grain size
i Current density
$i_0$ Equilibrium current density
OCP Open Circuit Potential
OP Operating Point
P Potential
T Temperature
V Voltage
Va Anodic potential
Vc Cathodic potential

What is claimed is:

1. A method for forming a capacitor for an integrated circuit, comprising the following sequence:
   providing a substrate;
   forming a first electrode including depositing a metal alloy layer formed from conductive material onto the substrate, the metal alloy layer comprising:
   a first surface and an exposed second surface, and
   grains having grain boundaries, wherein the grains are separated from one another by intergranular regions, the intergranular regions possessing a lower degree of crystalline order than the grains;
   electrochemically etching the exposed second surface of the metal alloy layer to increase a surface roughness of the second surface;
   oxidizing the metal alloy layer to form a capacitor dielectric on the first electrode; and
   forming a second electrode on the capacitor dielectric, wherein, during etching of the metal alloy layer, the intergranular regions are etched selectively to the grains to increase the surface roughness.

2. A method for forming a capacitor for an integrated circuit, comprising the following sequence:
   providing a substrate;
   forming a first electrode including a metal alloy layer comprising:

a first surface and an exposed second surface, and
grains having grain boundaries separated from one another by intergranular regions, wherein the intergranular regions have a lower degree of crystalline order than the grains;
increasing a surface roughness of the second surface of the metal alloy layer via electrochemical etching, wherein the substrate is immersed into an electrolyte and held at an anodic potential;
oxidizing the roughened second surface of the metal alloy layer to form a capacitor dielectric on the first electrode; and
depositing a second electrode,
wherein, during etching of the metal alloy layer, the intergranular regions are etched selectively to the grains.

3. The method of claim 1 further comprising thermally treating the metal alloy layer prior to etching.

4. The method of claim 1, wherein the metal alloy layer is formed by atomic layer deposition or by chemical vapor deposition.

5. The method of claim 1, wherein the metal alloy layer is deposited as a continuous conformal liner.

6. The method of claim 1, wherein providing a substrate includes forming a deep trench in a main surface of the substrate.

7. The method of claim 6, wherein a lower portion of the deep trench is widened by a wet etching.

8. The method of claim 2, further comprising thermally treating the metal alloy layer prior to etching.

9. The method of claim 2, wherein the metal alloy layer is formed by atomic layer deposition or by chemical vapor deposition.

10. The method of claim 2, wherein the metal alloy layer is deposited as a continuous conformal liner.

11. The method of claim 2, wherein the step of providing a substrate includes forming a deep trench in a main surface of the substrate.

12. The method of claim 11, wherein a lower portion of the deep trench is widened by a wet etching step.

13. The method of claim 1, wherein the metal alloy comprises at least a first metal and a second metal.

14. The method of claim 13, wherein the metal alloy comprises a binary metal alloy.

15. The method of claim 1, wherein the intergranular regions are etched at a higher rate than the grains to promote pitting of the metal alloy layer.

16. The method of claim 1, wherein the thermal treatment is effective to reduce an average size grain size of the grains.

17. The method of claim 16, wherein the thermal treatment reduces the average grain size to less than 20 nm.

* * * * *